(12) United States Patent
Kobayashi et al.

(10) Patent No.: US 6,480,067 B1
(45) Date of Patent: Nov. 12, 2002

(54) PEAKING CONTROL FOR WIDEBAND LASER DRIVER APPLICATIONS

(75) Inventors: Kevin Wesley Kobayashi, Torrance; George W. McIver, Redondo Beach, both of CA (US)

(73) Assignee: Sirenza Microdevices, Inc., Sunnyvale, CA (US)

( * ) Notice: Subject to any disclaimer, the term of this patent is extended or adjusted under 35 U.S.C. 154(b) by 59 days.

(21) Appl. No.: 09/723,298

(22) Filed: Nov. 27, 2000

(51) Int. Cl.[7] .................................................. H03G 3/30
(52) U.S. Cl. ........................ 330/279; 330/254; 330/285
(58) Field of Search ............................. 330/124 R, 254, 330/279, 285, 295; 327/312

(56) References Cited

U.S. PATENT DOCUMENTS

| | | | | |
|---|---|---|---|---|
| 4,795,923 A | * | 1/1989 | Dobos ......................... | 327/280 |
| 4,866,314 A | * | 9/1989 | Traa ............................ | 327/278 |
| 5,955,921 A | * | 9/1999 | Ide et al. .................... | 330/279 |
| 6,072,366 A | * | 6/2000 | Maeda et al. ............... | 330/254 |
| 6,163,215 A | * | 12/2000 | Shibata et al. ............. | 330/254 |

OTHER PUBLICATIONS

Novel Switched Current Source for Increasing Output Signal Edge Steepness of Current Switches Without Generating Large Overshoot, By Rainer H. Derksen, IEEE Journal of Solid–State Circuits, vol. 30, No. 5, May 1995, pp. 612–615.
A 0.4–$\mu$m CMOS 10–Gb/s 4–PAM Pre–Emphasis Serial Link Transmitter, By. Ramin Farjad–Rad et al., IEEE Journal of Solid–State Circuits, vol. 34, No. 5, May 1999, pp. 580–585.

* cited by examiner

*Primary Examiner*—Robert Pascal
*Assistant Examiner*—Khanh Van Nguyen
(74) *Attorney, Agent, or Firm*—Christopher P. Maiorana, P.C.

(57) ABSTRACT

An apparatus comprising a first amplifier, a second amplifier and a control circuit. The first amplifier may be configured to present a first amplified output signal in response to an input signal. The second amplifier may be configured to present a second amplified output signal to provide a shaped signal peaking response in response to the input signal. The first and second amplified output signals are generally combined. The control circuit may be configured to control a ratio between the first amplified output signal and the second amplified output signal. The ratio controls an amount of the peaking response.

22 Claims, 8 Drawing Sheets

PEAKING CONTROL FOR WIDEBAND LASER DRIVER APPLICATIONS

CROSS-REFERENCE TO RELATED APPLICATION(S)

The present invention may relate to co-pending application Ser. No. 09/723,037 filed Nov. 27, 2000, which is hereby incorporated by reference in its entirety.

FIELD OF THE INVENTION

The present invention relates to a method and/or architecture for wide band amplifiers generally and, more particularly, to a method and/or architecture for laser driver amplifiers that employ a method of shaping or equalizing a high data rate output signal waveform that may be used in fiber optic transmitter applications.

BACKGROUND OF THE INVENTION

The need for broadband integrated circuits (ICs) that incorporate peaking control is becoming a necessity rather than a luxury as the data rates and traffic of fiber optic systems increase. Peaking control in wideband integrated circuits is useful for adjusting gain and amplitude peaking in the frequency domain. Fiber optic data links require adjusting signal overshoot in the time domain for shaping the waveform of transmit and receive signals to achieve lower bit error rates. The need for adjustment of signal overshoot becomes more imperative for 10 gigabit per second fiber optic applications that require high volume-high IC yield with low tolerance to semiconductor process variations. Such applications include the emerging 10 gigabit Ethernet datacom systems.

A broadband IC which can modulate lasers or vertical cavity surface emitting lasers (VCSELs) at data rates up to 10 Gb/s and maintain low bit error rates is coveted by engineers building high speed Ethernet systems. In practice, laser driver ICs require pre-emphasis circuits or some type of control circuit which can compensate for the distortion introduced by the nonlinear laser or VCSEL. The signal passing through a linear laser driver modulator operating at 10 Gb/s can become distorted in the process of converting from electrical to optical energy as the laser diode or VCSEL is modulated by the linear electrical driver circuit. When conversion distortion occurs, it is desirable to drive the laser or VCSEL with a pre-distorted signal which compensates for the distortion produced by the nonlinear behavior of the VCSEL or laser. The pre-distortion may be implemented by a pre-emphasis or peaking function which superimposes a weighted peaking signal on the original signal to speed up the rise and falling edges of the original data waveform. The superimposed peaking signal enhances the data transition rise and fall times as well as reshapes the signal for low bit error rates (BER), inter-symbol interference (ISI), and maximum eye pattern opening.

Several conventional approaches for employing such pre-distortion comprise [1] dynamic current source switching (e.g., Rainer H. Derksen, Novel Switched Current Source for Increasing Output Signal Edge Steepness of Current Switches Without Generating Large Overshoot, IEEE JSSC, vol. 30, no. 5, May 1995) and [2] pre-emphasis (digital peaking) (e.g., Ramin Farjad-Rad, et. al., A 0.4-um CMOS 10-Gb/s 4-PAM Pre-Emphasis Serial Link Transmitter, IEEE JSSC, vol. 34, no. 5, May 1999), each of which is incorporated by reference in its entirety. Additionally, analog peaking techniques may be employed. The first two techniques are common-types of approaches which have had practical implementations at low data rates (i.e., 2.5 Gb/s and below). However, the implementations of these techniques at higher data rates is challenging. The effectiveness of these techniques can be marginal at 10 Gb/s and higher due to the quality of the raw data signal which provides a clock or trigger for the technique.

The analog peaking technique approach does not rely on using the raw data waveform as a clock or synchronizing signal for the technique to be effective and is therefore more suitable for higher data rate applications. Due to the recent availability of long and short wave VCSEL technology for 10 Gb/s, an effective device for employing pre-emphasis or peaking control is desired. Additionally, a device which is amenable to high volume-high yield manufacturing for 10 Gb/s VCSEL driver applications is needed.

SUMMARY OF THE INVENTION

The present invention concerns an apparatus comprising a first amplifier, a second amplifier and a control circuit. The first amplifier may be configured to present a first amplified output signal in response to an input signal. The second amplifier may be configured to present a second amplified output signal to provide a shaped signal peaking response in response to the input signal. The first and second amplified output signals are generally combined. The control circuit may be configured to control a ratio between the first amplified output signal and the second amplified output signal. The ratio controls an amount of the peaking response.

The objects, features and advantages of the present invention include providing a method and/or architecture for implementing laser driver amplifiers that may (i) provide shaping or equalizing of a high data rate output signal waveform; (ii) be used in fiber optic transmitter applications; (iii) employ a switched architecture for switching between a regenerative peaking amplifier and a conventional amplifier; (iv) implement a switching circuit that may allow variable weighted employment of the peaking amplifier; (v) provide AC coupling of the peaking amplifier with a speedup capacitor and resistor which may allow a degree of freedom to set up a decay time constant; (vi) implement variability in AC coupling, and/or (vii) implement a tap point that may optimize the time superposition of the peak and unpeaked signals at the output.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

The present invention describes an analog peaking control circuit which can provide significant performance benefits for data rates in excess of 10 Gb/s. The present invention may provide enough tuning latitude to compensate for process manufacturing variations.

Figure 1:
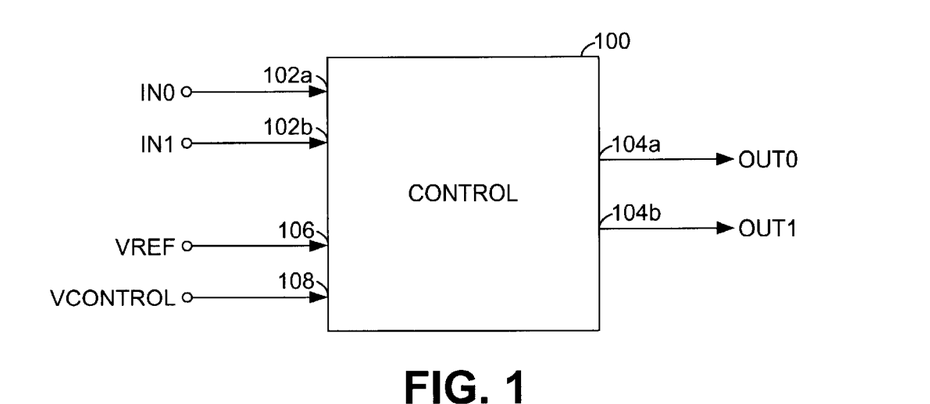
FIG. 1 is a block diagram of a preferred embodiment of the present invention.

Referring to FIG. 1, a block diagram of a system (or circuit) 100 is shown in accordance with a preferred embodiment of the present invention. The circuit 100 may be implemented, in one example, as a monolithic integrated circuit. The circuit 100 may have an input 102a that generally receives an input signal (e.g., IN0) and an input 102b that generally receives the input signal (e.g., IN1). The circuit 100 may have an output 104a that presents an output signal (e.g., OUT0) and an output 104b that presents an output signal (e.g., OUT1). The circuit 100 may also have an input 106 that receives a voltage reference signal (e.g., VREF) and an input 108 that generally receives a control signal (e.g., VCONTROL). The input signals IN0 and IN1 are generally differential input signals. The output signals OUT0 and OUT1 are generally differential output signals.

The circuit 100 may be particularly suitable for implementing peaking control for wideband laser driver applications. The peaking control technique of the circuit 100 may be implemented, for example, in a 10 Gb/s laser driver IC for datacom and telecom applications or 10 Gb/s limiter amplifier applications.

Figure 2:
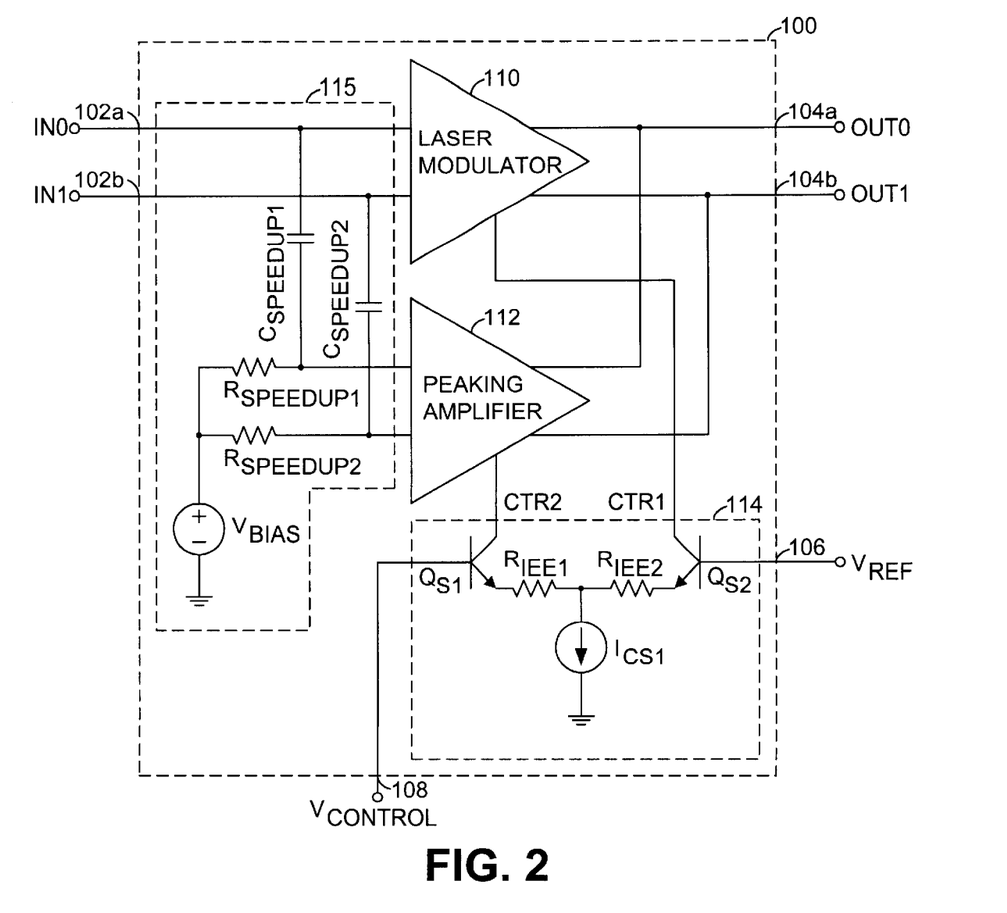
FIG. 2 is a detailed block diagram of a preferred embodiment of the present invention.

Referring to FIG. 2, a more detailed diagram of the circuit 100 is shown. The circuit 100 generally comprises a circuit 110, a circuit 112, a circuit 114, and a circuit 115. The circuit 115 may be implemented as an AC coupling speed-up circuit. The circuit 115 generally comprises a capacitor (e.g., CSPEEDUP1), a capacitor (e.g., CSPEEDUP2), a resistor (e.g., RSPEEDUP1), a resistor (e.g., RSPEEDUP2) and a bias signal (e.g., VBIAS). The circuit 110 may be implemented, in one example, as a laser modulator circuit. The circuit 112 may be implemented, in one example, as a peaking (or regenerative) amplifier circuit. The circuit 114 may be implemented as a control circuit. In one example, the circuit 114 may be implemented as a current source switch.

The laser modulator 110 may have a first input that may receive the input signal IN0 and a second input that may receive the signal IN1. The peaking amplifier circuit 112 may have a first input that may receive the signal IN0 through the capacitor CSPEEDUP1. The first input of the peaking amplifier 112 may also be connected to the bias signal VBIAS through the resistor RSPEEDUP1. The laser modulator circuit 110 may also receive a control signal (e.g, CTR1) from the circuit 114.

The peaking amplifier 112 may have a second input that may receive the signal IN1 through the capacitor CSPEEDUP2 and the signal VBIAS through the resistor RSPEEDUP2. The peaking amplifier 112 may also receive a control signal (e.g., CTR2) from the circuit 114. A first output of the laser modulator 110 and a first output of the peaking amplifier 112 are combined to present the signal OUT0. Similarly, a second output of the laser modulator 110 and a second output of the peaking amplifier 112 are combined to present the signal OUT1. The first and second output signals OUT1 and OUT2 may be derived (i) completely from the laser modulator 110, (ii) completely from the peaking amplifier 112, or (iii) as a combination of the laser modulator 110 and the peaking amplifier 112.

The circuit 114 generally comprises a transistor (e.g., QS1), a transistor (e.g., QS2), a resistor (e.g., Rlee1), a resistor (e.g., Rlee2) and a current source (e.g., ICS1). The circuit 114 generates the signals CTR1 and CTR2 via the transistors QS1 and QS2. The circuit 114 may allow the circuit 100 to provide peaking control of the signals OUT0 and OUT1 by setting the ratio of signals presented from the laser modulator 110 and the peaking amplifier 112.

The amplifier 110 and the amplifier 112 may be implemented as differential topologies. For example, the circuit 114 may be employed for switching the bias tail currents such that a weighted ratio between amplified modulator 110 and peaking amplifier 112 may be set to obtain varying degrees of peaking response. In one example, the circuit 114 may be configured as an emitter degenerated differential amplifier. However, the circuit 114 may be implemented as other appropriate type devices in order to meet the criteria of a particular implementation. The resistors Rlee1 and Rlee2 may be implemented as emitter degeneration resistors. The current source ICS1 may effectively become the peak modulation current that drives a laser from the outputs OUT0 and OUT1.

By varying the signal VCONTROL, various degrees of peaking may be superimposed on the modulating signal (e.g., OUT0 and OUT1). The degeneration resistors Rlee1 and Rlee2 may be implemented to control the sensitivity of the amount of current switched in response to an adjustment of the signal VCONTROL. The sensitivity control can be useful in closed loop applications where the output detected signal is used as a feedback to the voltage control adjustment VCONTROL. In one example, the control circuit 114 may be replaced by two independent fixed current sources which could be set once without any current switch (steering) capabilities. In such an example, the independent current sources could be programmed by a digital to analog converter (DAC) controlled by a microprocessor.

The inputs of the peaking amplifier 112 are generally AC coupled with the capacitors CSPEEDUP1 and CSPEEDUP2 which form a high pass filter response with the resistors RSPEEDUP1 and RSPEEDUP2. The capacitance values of the capacitors CSPEEDUP1 and CSPEEDUP2 and the resistors RSPEEDUP1 and RSPEEDUP2 generally set a high pass pole which determines the peaking response of the circuit 100.

Figure 3:
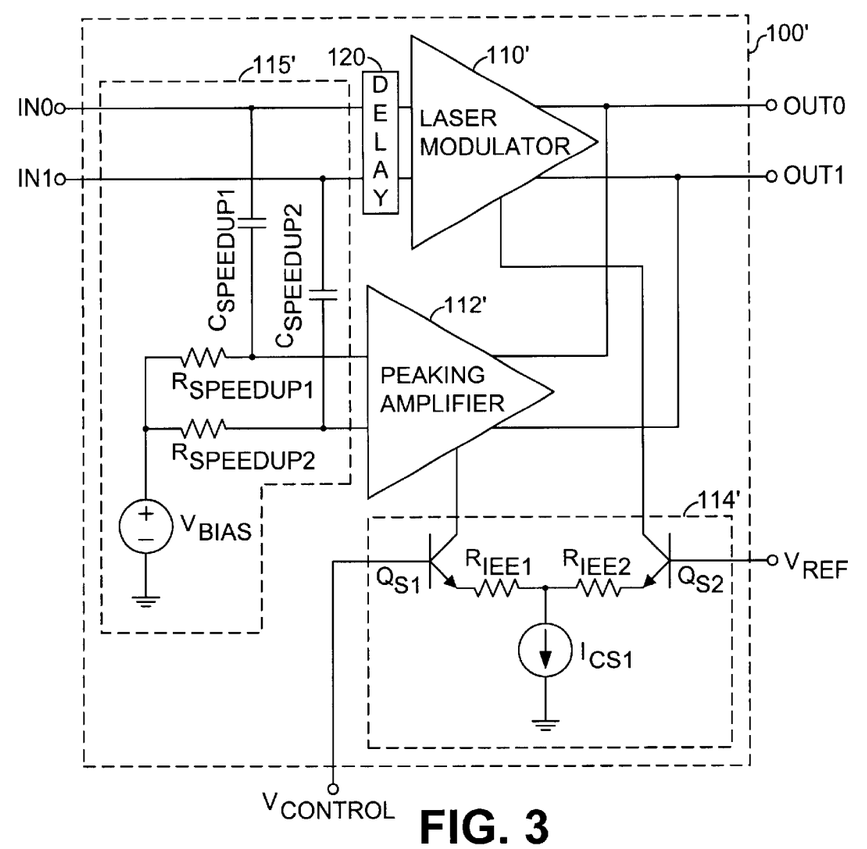
FIG. 3 is a detailed block diagram of a preferred embodiment of the present invention which incorporates a delay function.

Referring to FIG. 3, an alternate embodiment of the circuit 100' is shown. The circuit 100' may be similar to the circuit 100. The circuit 100' further comprises a delay element 120 that may be inserted just before the laser modulator output stage 110'. The delay element 120 may superimpose the peaking signal earlier with respect to the unpeaked signal waveform. The delay element 120 may be implemented as a simple emitter follower, a transmission line, a lumped inductor/resistor/capacitor (LRC) network or other appropriate delay to meet the design criteria of a particular implementation.

Figure 4:
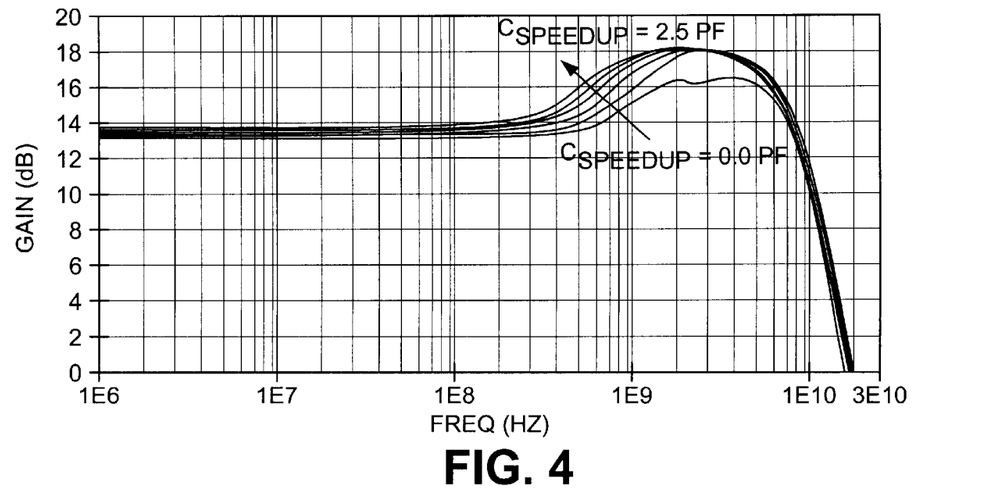
FIG. 4 is a plot illustrating the gain peaking operation of the present invention.

FIG. 4 illustrates the gain-frequency peaking response of the complete modulator driver circuit 100 for various values of the capacitors CSPEEDUP1 and CSPEEDUP2 ranging from 0 to 2.5 pF. The control circuit 114 may be set for balanced operation or the peaking circuit 112 is sourcing 50% of the current ICS1 and the other 50% of the current is biasing the main modulator driver amplifier 110. The AC coupling can be tapped at various stages preceding the output modulator stage 110. The peak amplified waveform can be skewed in time with respect to the original unpeaked signal in order to optimize the predistortion waveform. For example, the peak amplifier stage 112 may be coupled at the input of the laser modulator stage 110 in order to superimpose the peak-amplified signal earlier (in time) with respect to unpeaked modulator output waveform. The circuit 100 may speed up the rise and fall edges of the signals OUT1 and OUT2. The circuit 100 may provide an optimum delay that may improve overall performance of the circuit 100.

Figure 5:
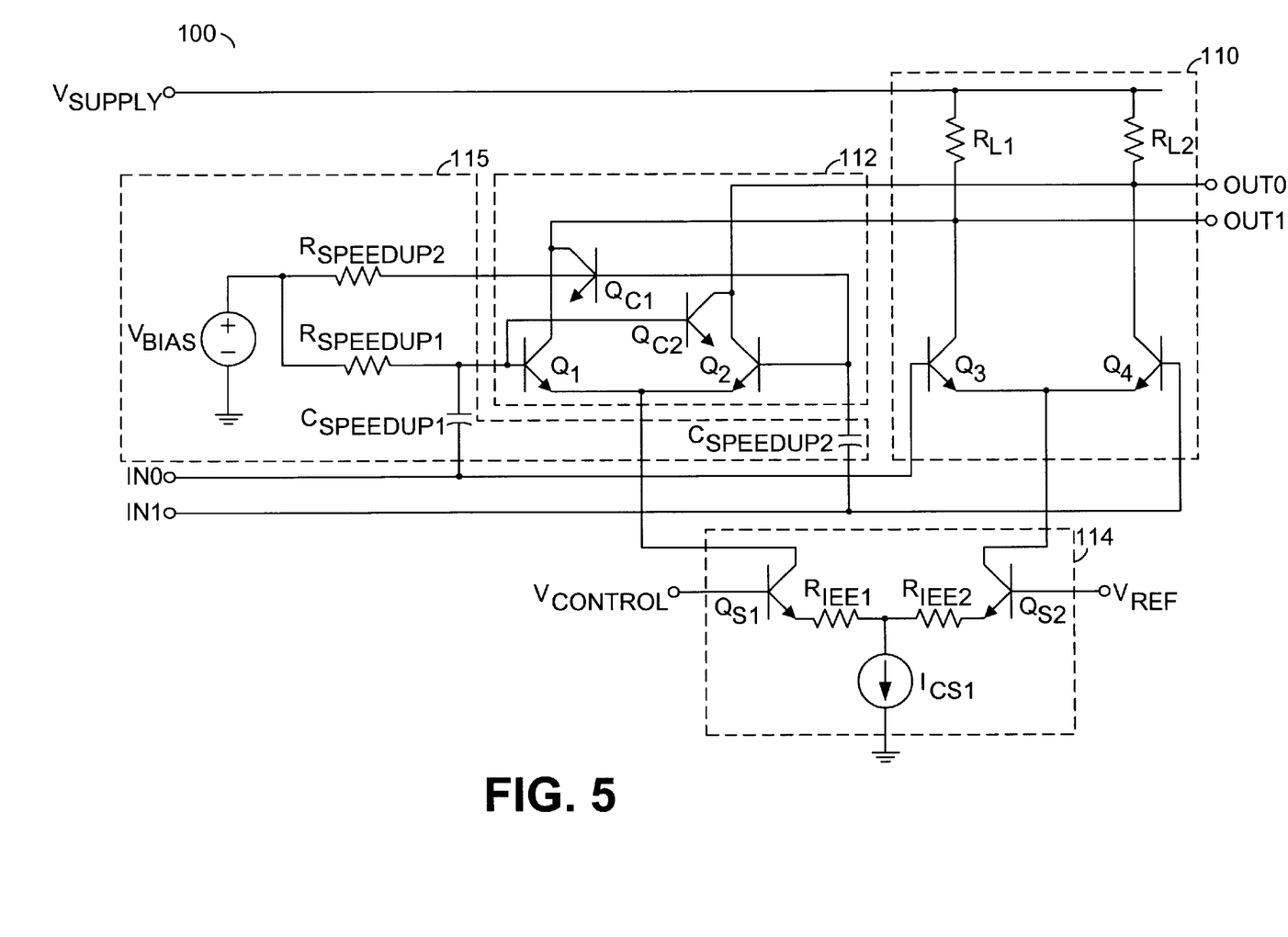
FIG. 5 is a schematic of a preferred embodiment of the present invention.

Referring to FIG. 5, a detailed diagram of the circuit 100 is shown. The current switch 114 and the AC coupling speed up circuit 115 may be identical in function and component to that shown in the general conceptual diagram of FIG. 2. The implementation of the main laser modulator amplifier 110 and the peaking amplifier 112 is shown in more detail. The laser modulator circuit 110 generally comprises a differential amplifier formed by a transistor (e.g., Q3) and a transistor (e.g., Q4) and a load formed by a resistor (e.g., RL1) and a resistor (e.g., RL2). The peaking amplifier 112 is topologically connected in parallel with the laser modulator amplifier 110. The amplifier 112 generally comprises a differential amplifier with a transistor (e.g., Q1) and a transistor (e.g., Q2) that may have bases that are AC coupled to the inputs of the driver circuit IN0 and IN1. The amplifier 112 also comprises a transistor (e.g., Qc1) and a transistor (e.g., Qc2) that may be cross coupled. The transistors Qc1 and Qc2 may provide regenerative capacitive feedback through respective collector-base capacitances.

The size (e.g., emitter area) of the transistors Qc1 and Qc2 may set the amount of regenerative feedback (e.g., peaking response). In general, the transistors Qc1 and Qc2 are substantially identical in area in order to obtain a symmetrically enhanced signal. However, the circuit 100 may be implemented where the transistors Qc1 and Qc2 are not symmetrical in area, such as in an active balun application. The collectors of the current source switch 114 are connected to the common-emitters of the transistors Q1 and Q2 and the transistors Q3 and Q4 and may change the amount of effective peaking provided by the peaking amplifier 112. In the frequency domain, the peaking circuit 112 may aid in broadening the gain bandwidth of the amplifier, peaking the gain response at the upper band edge.

FIGS. 6–9 illustrate the peaking control response as the amount of peak amplifier source (bias) current is increased (measured in % of Ics1, e.g., 20% UI indicates 20% of the current is steered through the peak amplifier 112 while 80% of the current is steered through the laser modulator amplifier 110) for the capacitors CSPEEDUP1 and CSPEEDUP2 and the resistors RSPEEDUP1 and RSPEEDUP2 of 0.3 pF and 100 ohms, respectively. In one example, the circuit 100 may be implemented in a commercially available HBT process with a typical cut-off frequency of 35 GHz. However, other processes technologies (e.g., SiGe, GaAs, etc.) may be used to meet the design criteria of a particular implementation.

Figure 6:
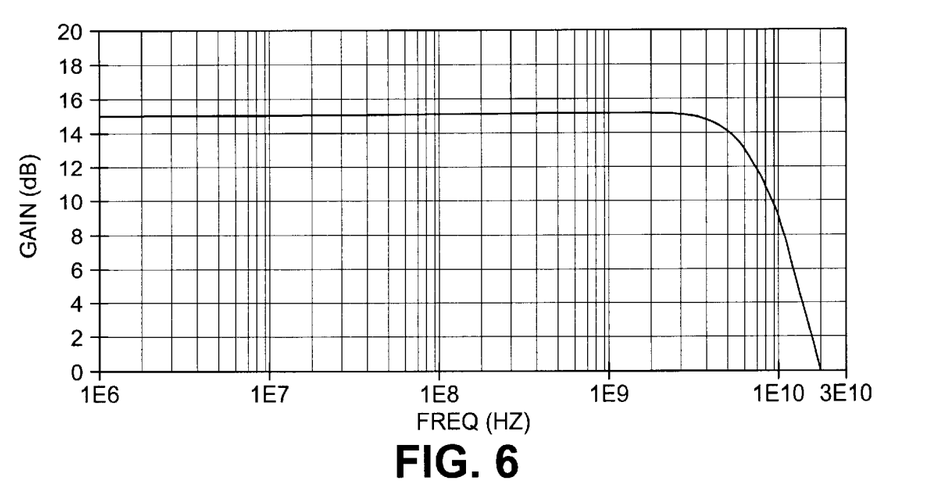
FIG. 6 is a plot illustrating the unpeaking gain-frequency operation of the present invention.

FIG. 6 illustrates the gain response with no peaking employed (0% Ics1 current is sourced through the peak amplifier 112 and all the current Ics1 is sourced through the laser modulator amplifier 110). FIG. 6 illustrates a flat gain and butterworth low pass roll off response. The gain is 15 dB and the 3-dB bandwidth is 7 GHz.

Figure 7:
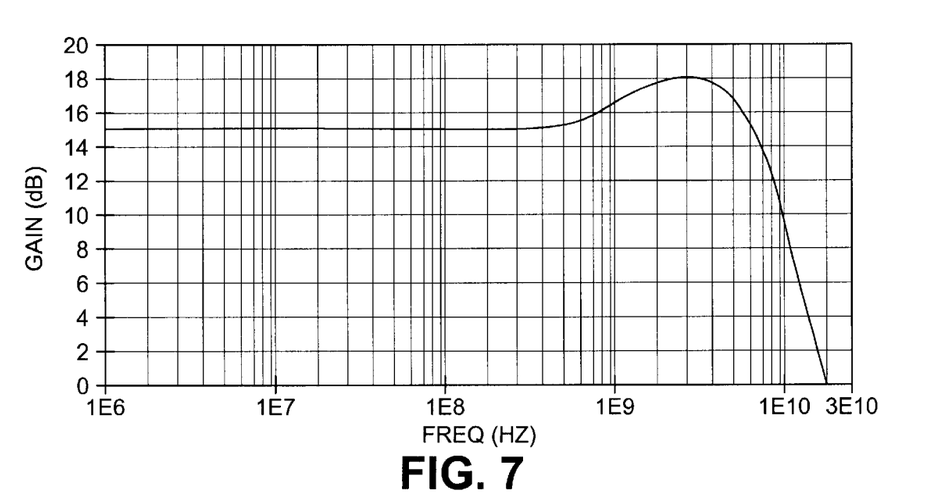
FIG. 7 is a plot illustrating 20% gain peaking operation of the present invention.

FIG. 7 illustrates the gain response case where the peak amplifier 112 is biased with 20% of Ics1 (80% of Ics1 is sourced through the laser modulator amplifier 110). The gain is 15.3 dB and the 3-dB bandwidth increased to 9 GHz.

Figure 8:
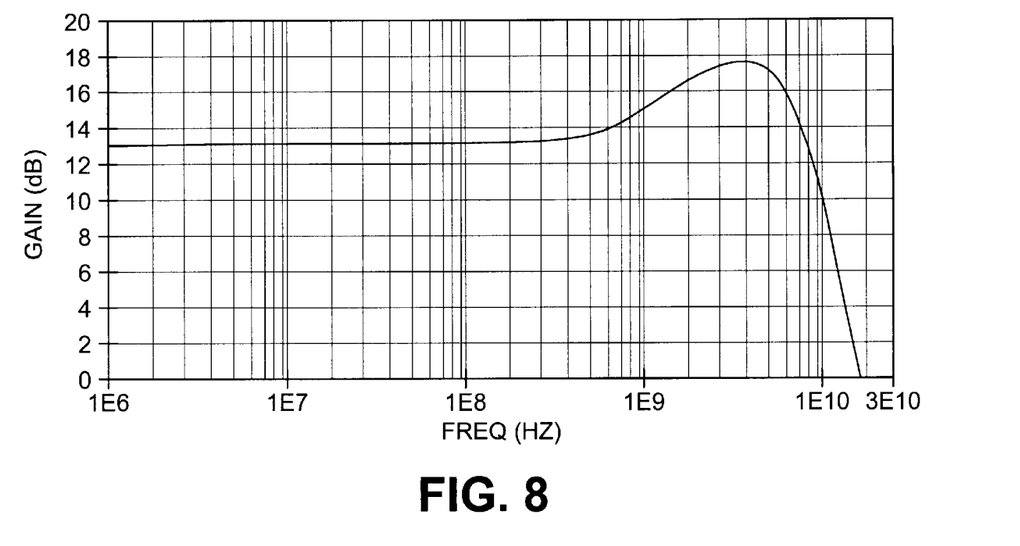
FIG. 8 is a plot illustrating 50% gain peaking operation of the present invention.

FIG. 8 illustrates the case for 50% Ics1 peak amplifier bias. The gain is 13 dB and the bandwidth has increased even further to 10 GHz.

Figure 9:
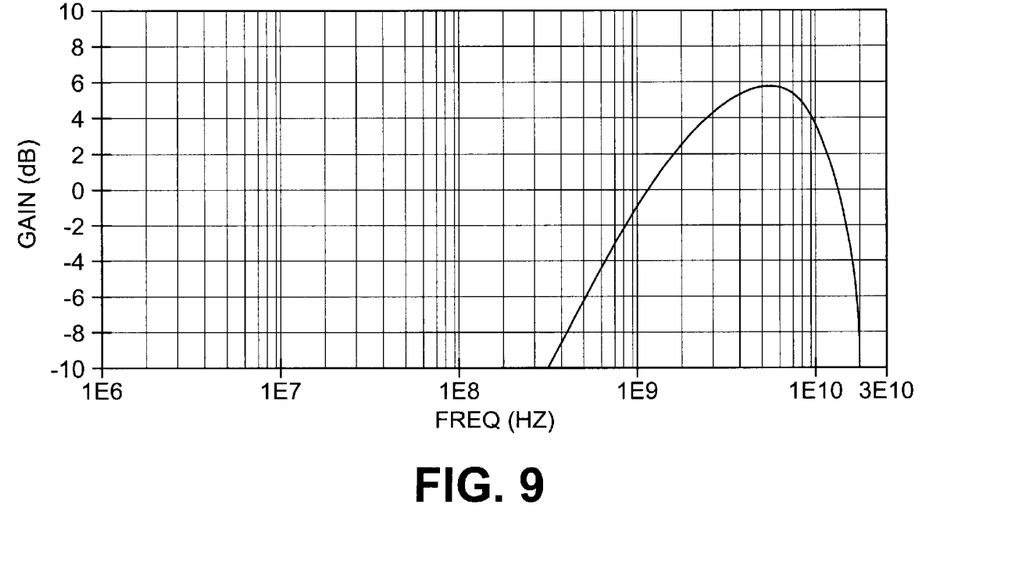
FIG. 9 is a plot illustrating 100% gain peaking operation of the present invention.

FIG. 9 illustrates the case where 100% of Ics1 is biasing the peak amplifier 112. This response demonstrates that excessive amount of peaking can be achieved. The resulting tuning latitude can more than accommodate or equalize the gain bandwidth variations due to process manufacture variations.

Figure 10:
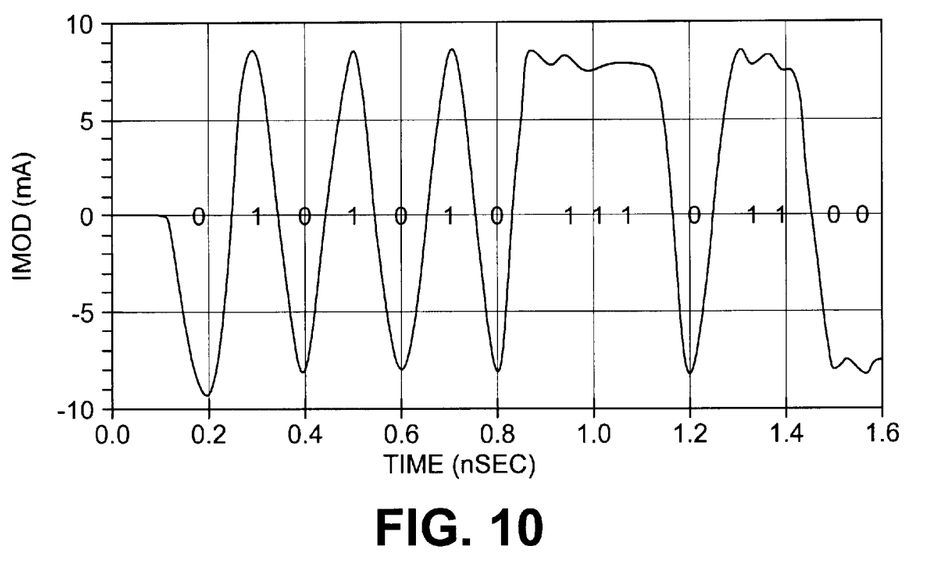
FIG. 10 is a plot illustrating unpeaked time domain operation of the present invention.
Figure 11:
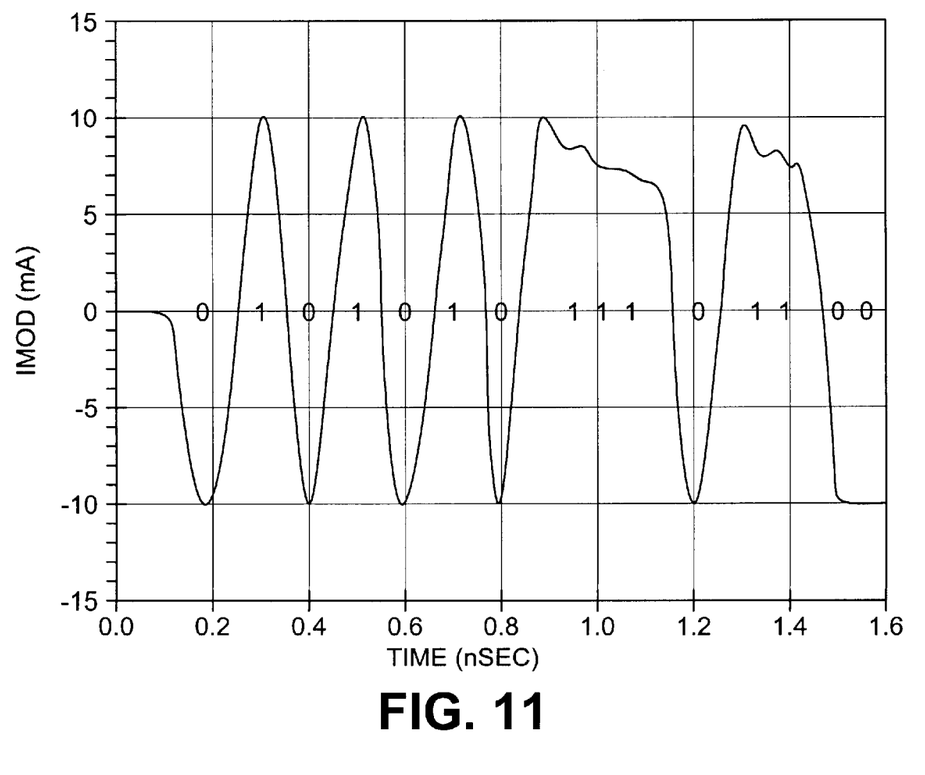
FIG. 11 is a plot illustrating 20% peaking time domain operation of the present invention.
Figure 12:
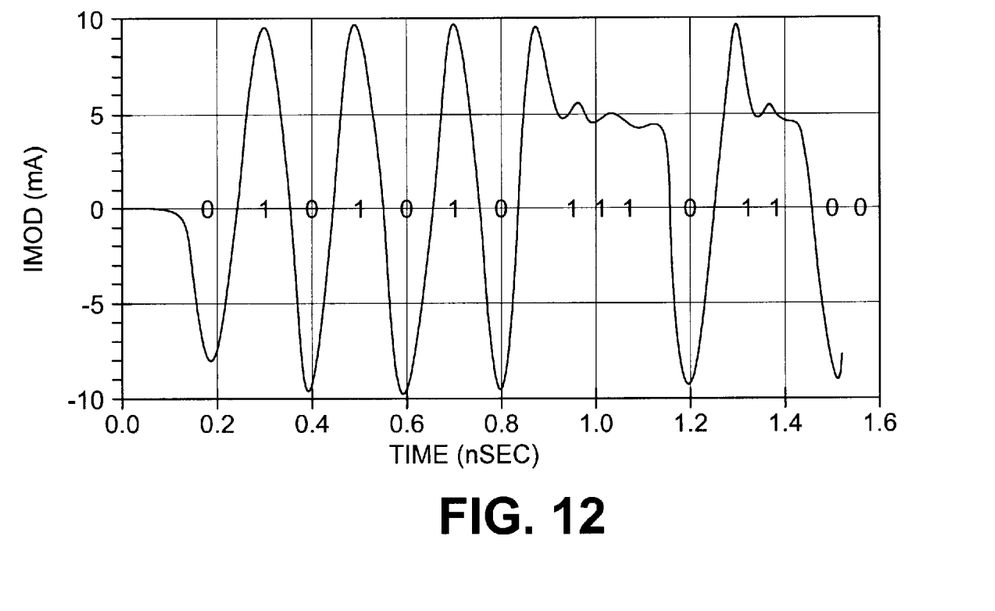
FIG. 12 is a plot illustrating 50% peaking time domain operation of the present invention.

The adjustable peak control has a corresponding effect on the time domain output current waveform as illustrated in FIGS. 10–12. FIG. 10 shows a 10 Gb/s output modulation current data stream in response to the input data stream pattern "01010101110110" after it has been amplified by the laser driver with no peaking employed. This illustrates the NO PEAKING case where there is no bias current running through the regenerative peaking amplifier and where all the current Ics1 is running through the main laser modulator amplifier 110. This figure reflects the minimal peaking or overshoot response case of the output current waveform.

FIG. 11 illustrates the case where the current source switch 114 is adjusted for 20% peaking (20% of Ics1 is steered through the peak amplifier 112 with the remainder being sourced from the laser modulator amplifier 110). In this case there is a slight peaking response that is evident on the rising edge of the 111 and 11 patterns. This additional peaking, which has been superimposed on the amplified data signal, can be adjusted to just cancel the nonlinear RC slewing characteristic imposed by the nonlinear laser or VCSEL diode in order to improve the overall BER and intersymbol interference. From a qualitative standpoint, an improvement in the rise-fall time and eye opening of the eye diagram may result.

FIG. 12 illustrates the case where the current source switch 114 is adjusted for 50% peaking (current) and illustrates an even more pronounced overshoot response which could compensate yet a poorer VCSEL distortion characteristic.

Figure 13:
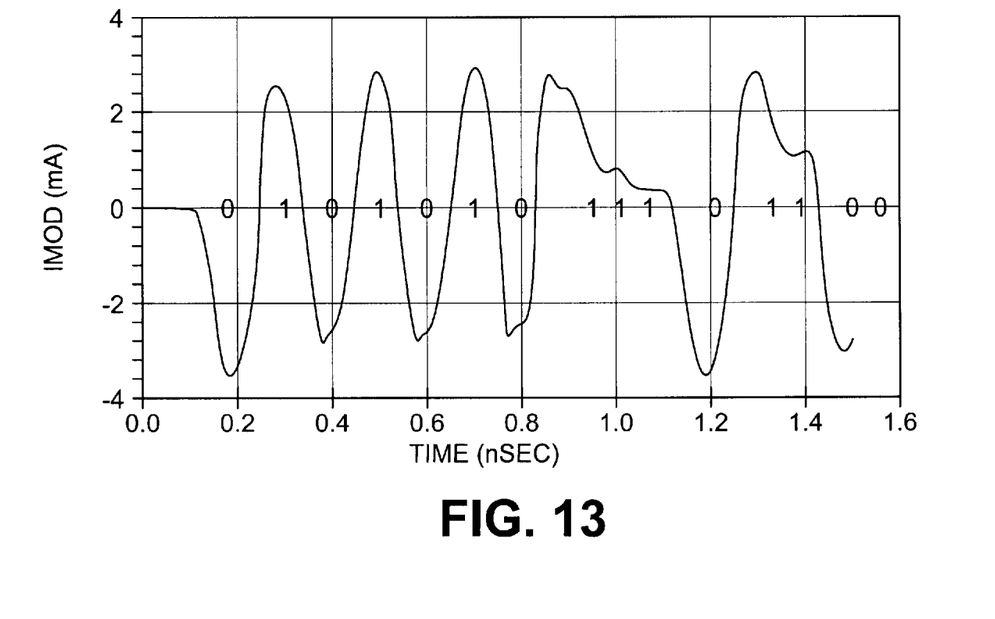
FIG. 13 is a plot illustrating 100% peaking time domain operation of the present invention.

FIG. 13 illustrates the case where the current switch 114 is adjusted for 100% Ics1 current sourced through the peak amplifier 112 and represents the maximum overshoot (peaking) attainable for this given example. For implementation reasons, the case of 100% peaking may not be practical. However, the degree of tuning may more than compensate for manufacture process variations.

Figure 14:
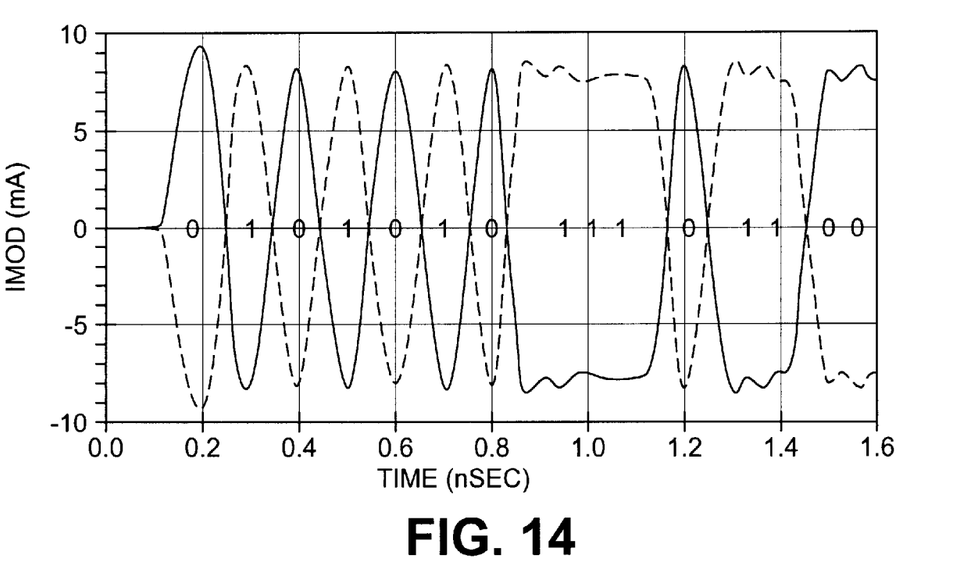
FIG. 14 is a plot illustrating the unpeaking differential output voltage performance in response to a data stream operation of the present invention.

FIG. 14 illustrates the complementary output response to the same input bit stream used in the above example and illustrates symmetrical and unambiguous complementary output data waveforms. FIG. 14 exhibits that the peaking response is effective on both rising and falling signal edges and may have a symmetrical impact on the peaked output data stream.

The circuit 100 may provide a unique peaking control which may improve the bandwidth of amplifiers used in wideband applications. Specifically, the circuit 100 may be implemented in fiber optic transmit and receive applications where operation is extended to 10 Gb/s and beyond. The peaking device may apply to transimpedance amplifiers, limiter amplifiers, and laser driver amplifiers, and more specifically bipolar amplifier implementations using heterojunction bipolar transistor technology. It should be understood that this invention is not limited to the exact construction illustrated and described above, but that various changes may be made without departing from the spirit and scope of the invention.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
    a first amplifier configured to present a first amplified output signal in response to an input signal;
    a second amplifier configured to present a second amplified output signal to provide a shaped signal peaking response in response to said input signal, wherein said first and second amplified output signals are combined;
    a control circuit configured to control a ratio between said first amplified output signal and said second amplified output signal, wherein said ratio controls an amount of said peaking response; and
    a coupling circuit configured between said input signal and said first and second amplifiers, wherein said coupling circuit is configured to increase the speed of propagation of said input signal.

2. The apparatus according to claim 1, wherein said first amplifier comprises a laser modulator amplifier and said second amplifier comprises a peaking amplifier.

3. The apparatus according to claim 1, wherein said control circuit is further configured to tune an amount of peaking of the second amplifier circuit.

4. The apparatus according to claim 1, further comprising a delay circuit configured to delay the input signal before being presented to said first amplifier.

5. The apparatus according to claim 1, wherein said coupling circuit comprises:
    one or more capacitors;
    one or more resistors; and
    one or more bias signals, wherein a ratio of said capacitors and resistors controls said speed of propagation.

6. The apparatus according to claim 1, wherein said control circuit comprises a current source switch.

7. The apparatus according to claim 7, wherein said control circuit is configured to generate (i) a first control signal configured to control said first amplifier and (ii) a second control signal configured to control said second amplifier.

8. The apparatus according to claim 8, wherein said first and second control signals comprise portions of a current source.

9. The apparatus according to claim 7, wherein said first control signal comprises a first current source and said second control signal comprises a second current source wherein said first and second current sources are independently implemented.

10. The apparatus according to claim 1, wherein said first amplifier comprises a first differential transistor pair.

11. The apparatus according to claim 10, wherein said first differential transistor pair comprises a first transistor and a second transistor having a substantially equal size.

12. The apparatus according to claim 10, wherein said first differential transistor pair comprises a first transistor and a second transistor having different sizes, wherein said apparatus is implemented in a balun environment.

13. The apparatus according to claim 10, wherein said second amplifier comprises a second differential transistor pair.

14. The apparatus according to claim 13, wherein:
    said input signal comprises a differential input signal presented to said first and second differential transistor pair; and
    said output signal comprises a differential output signal presented by said first and second differential transistor pair.

15. The apparatus according to claim 13, wherein said first and second differential transistor pairs are implemented using heterojunction bipolar technology.

16. The apparatus according to claim 15, wherein said first and second differential transistor pairs are implemented using a GaAs process.

17. The apparatus according to claim 15, wherein said first and second differential transistor pairs are implemented using a SiGe process.

18. The apparatus according to claim 13, wherein an area of said second differential transistor pair is configured to be adjusted in order to provide appropriate peaking capability.

19. The apparatus according to claim 1, wherein said apparatus is implemented as a monolithic integrated circuit.

20. The apparatus according to claim 1, wherein said second amplifier comprises:
    a first differential transistor pair;
    a second differential transistor pair, wherein each of said first and second differential transistor pairs have a collector coupled to said first and second amplified output signals, an emitter coupled to ground or said control circuit and a base coupled to a time control current.

21. An apparatus comprising:
    means for generating a first amplified output signal in response to an input signal;
    means for generating a second amplified output signal for providing a shaped signal peaking response in response to said input signal, wherein said first and second amplified output signals are combined;
    means for controlling a ratio between said first amplified output signal and said second amplified output signal, wherein said ratio controls an amount of said peaking response; and
    means for coupling said input signal and said first and second amplifiers, wherein said coupling means increases the speed of propagation of said input signal.

22. A method for controlling an output signal comprising the steps of:
    (A) generating a first amplified output signal in response to an input signal;
    (B) generating a second amplified output signal for providing a shaped signal peaking response in response to said input signal, wherein said first and second amplified output signals are combined;
    (C) controlling a ratio between said first amplified output signal and said second amplified output signal, wherein said ratio controls an amount of said peaking response; and
    (D) increasing the speed of propagation of said input signal before said input signal is received by step (A) and step (B).

* * * * *